(12) United States Patent
Kim et al.

(10) Patent No.: US 9,685,466 B2
(45) Date of Patent: Jun. 20, 2017

(54) THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Heecheol Kim, Beijing (CN); Youngsuk Song, Beijing (CN); Seongyeol Yoo, Beijing (CN); Seungjin Choi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/499,210

(22) Filed: Sep. 28, 2014

(65) Prior Publication Data
US 2015/0380433 A1 Dec. 31, 2015

(30) Foreign Application Priority Data
Jun. 27, 2014 (CN) .......................... 2014 1 0302733

(51) Int. Cl.
*H01L 27/12* (2006.01)
*H01L 29/417* (2006.01)
*H01L 29/786* (2006.01)

(52) U.S. Cl.
CPC ........ *H01L 27/124* (2013.01); *H01L 29/4175* (2013.01); *H01L 29/41733* (2013.01); *H01L 29/7869* (2013.01); *H01L 29/78669* (2013.01); *H01L 29/78678* (2013.01); *H01L 29/78696* (2013.01)

(58) Field of Classification Search
CPC ............. H01L 27/124; H01L 29/41733; H01L 29/4175; H01L 29/78669; H01L 29/78678; H01L 29/7869
See application file for complete search history.

(56) References Cited

U.S. PATENT DOCUMENTS 9,040,994 B2 5/2015 Rhee et al.
2007/0152220 A1* 7/2007 Kwack .................. G02F 1/1362
257/59

(Continued)

FOREIGN PATENT DOCUMENTS

CN 102254938 A 11/2011
CN 102779783 A 11/2012

(Continued)

OTHER PUBLICATIONS

Translation of CN102254938.*

(Continued)

*Primary Examiner* — Whitney T Moore
(74) *Attorney, Agent, or Firm* — Harness, Dickey & Pierce, P.L.C.

(57) ABSTRACT

The present invention provides a TFT, an array substrate and a display device. The TFT includes a gate electrode, a source electrode, a drain electrode, and a semiconductor layer. The source electrode and the drain electrode are arranged on different layers. The semiconductor layer is in electrical connection to the source electrode and the drain electrode, respectively; wherein, a region on the semiconductor layer which is corresponding to a region between the source electrode and the drain electrode is a channel region. The present invention also provides an array substrate and a display device comprising the on TFT.

11 Claims, 6 Drawing Sheets

(56) References Cited

U.S. PATENT DOCUMENTS

| | | | |
|---|---|---|---|
| 2009/0101895 A1* | 4/2009 | Kawamura | H01L 27/1225 257/43 |
| 2009/0224257 A1* | 9/2009 | Chin | H01L 27/124 257/72 |
| 2012/0133865 A1* | 5/2012 | Yonemura | 349/96 |
| 2012/0315735 A1* | 12/2012 | Koezuka et al. | 438/301 |
| 2013/0057793 A1* | 3/2013 | Uchida | 349/42 |
| 2013/0155356 A1* | 6/2013 | Jang et al. | 349/106 |
| 2014/0077205 A1* | 3/2014 | Yamazaki | H01L 29/66969 257/43 |
| 2014/0097437 A1 | 4/2014 | Rhee et al. | |
| 2015/0137126 A1* | 5/2015 | Shen | H01L 21/77 257/59 |

FOREIGN PATENT DOCUMENTS

| | | | |
|---|---|---|---|
| CN | 103000693 A | 3/2013 | |
| CN | 203932068 U | 11/2014 | |
| WO | WO-2011142061 A1 | 11/2011 | |

OTHER PUBLICATIONS

Office Action regarding Chinese Patent Application No. 201410302733.0, dated May 24, 2016. Translation provided by Dragon Intellectual Property Law Firm.

Second Office Action regarding Chinese application No. 201410302733.0, dated Sep. 18, 2016. Translation provided by Dragon Intellectual Property Law Firm.

\* cited by examiner

THIN FILM TRANSISTOR, ARRAY SUBSTRATE AND DISPLAY DEVICE

CROSS-REFERENCE TO RELATED APPLICATION

The present invention claims a priority of the Chinese patent application No. 201410302733.0 filed on Jun. 27, 2014, which is incorporated herein by reference in its entirety.

FIELD OF THE INVENTION

The present invention relates to the field of liquid crystal display, in particular to a thin film transistor, an array substrate and a display device.

DESCRIPTION OF THE PRIOR ART

Currently, thin film transistor liquid crystal displays (TFT-LCDs) have become increasingly favored by customers in the LCD industry.

FIG. 1 shows a structure of a TFT in an existing liquid crystal display. The TFT includes a substrate 01, and a gate electrode 02 formed on the substrate 01 and covered with a gate insulating layer 03. A semiconductor layer 04 is also formed on the gate insulating layer 03. The semiconductor layer 04 corresponds to the gate electrode 02 and is located thereabove. An etch mask layer 05 is formed on the semiconductor layer 04, and a source/drain metal layer is formed on the etch mask layer 05 so as to form a drain electrode 06 and a source electrode 7 by a layout process. The drain electrode 06 and the source electrode 07 are formed on an identical layer, but separated from each other at a certain interval. Due to the limitation of the layout process, the drain electrode 06 and the source electrode 07 are in complete contact with the semiconductor layer 04 through via-holes in the etch mask layer 05, the drain electrode 06 and the source electrode 07 each is arranged to correspond a via-hole, and a sufficient length of a channel between the source and drain electrodes needs to be maintained, and the drain electrode 06 and the source electrode 07 each have a length of at least 5 μm on the semiconductor layer 04. Hence, the channel region has a length L' of at least 15 μm.

As mentioned above, due to the limitation of a manufacturing process, the channel has a length of at least 15 μm, which means the length of the TFT is relatively long, so the TFT will be less efficient.

SUMMARY OF THE INVENTION

An object of the present invention is to reduce a channel length, and improve the working efficiency of a TFT.

In order to achieve above object, in one aspect, the present invention provides a TFT, including a gate electrode, a source electrode, a drain electrode, and a semiconductor layer. The source electrode and the drain electrode are arranged on different layers.

The semiconductor layer is in electrical connection to the source electrode and the drain electrode, respectively.

Wherein, a region on the semiconductor layer between the source electrode and the drain electrode is a channel region.

Alternatively, the source electrode and the drain electrode being arranged on different layers including:

The source electrode and the drain electrode being arranged at two sides of the semiconductor layer, respectively.

Wherein, the source electrode is arranged above the semiconductor layer, and the drain electrode is arranged below the semiconductor layer, or the drain electrode is arranged above the semiconductor layer and the source electrode is arranged below the semiconductor layer.

Alternatively, the semiconductor layer is made of a-Si or poly-Si.

Alternatively, the semiconductor layer is made of a metal oxide semiconductor material.

Alternatively, an etch mask layer is arranged on the semiconductor layer and at a position corresponding to the channel region.

Alternatively, the etch mask layer is further arranged on the semiconductor layer and at a region outside the channel region.

Alternatively, the etch mask layer is provided with a via-hole at a position corresponding to the source electrode or the drain electrode.

Alternatively, a gate insulating layer is provided between the semiconductor layer and the gate electrode.

In another aspect, in order to achieve the above mentioned object, the present invention further provides an array substrate, including a substrate, a TFT, a pixel electrode, a gate line and a data line. The TFT and the gate line are arranged on the substrate, and a source electrode of the TFT and a drain electrode of the TFT are arranged on different layers.

A semiconductor layer of the TFT is in electrical connection to the source electrode and the drain electrode, respectively.

The pixel electrode is in electrical connection to the drain electrode of the TFT, and the source electrode of the TFT is in electrical connection to the data line Alternatively, the source electrode of the TFT and the drain electrode of the TFT being arranged on different layer including:

the source electrode of the TFT and the drain electrode of the TFT being arranged at two sides of the semiconductor layer, respectively. Wherein, the source electrode is arranged above the semiconductor layer, the drain electrode is arranged below the semiconductor layer and the pixel electrode is arranged below the semiconductor layer; or the drain electrode is arranged above the semiconductor layer, the source electrode is arranged below the semiconductor layer and the pixel electrode is arranged above the semiconductor layer.

Alternatively, the array substrate further includes a common electrode, and a passivation layer arranged between the pixel electrode and the common electrode.

Alternatively, the common electrode is arranged above or below the pixel electrode.

Alternatively, an etch mask layer is arranged on the semiconductor layer.

Alternatively, the etch mask layer is provided with a via-hole which is arranged at a region corresponding to the drain electrode, and the drain electrode is in electrical connection to the semiconductor layer through the via-hole; or the etch mask layer is provided with a via-hole which is arranged at a region corresponding to the source electrode, and the source electrode is in electrical connection to the semiconductor layer through the via-hole.

Alternatively, the pixel electrode is arranged on the drain electrode, and the pixel electrode is in electrical connection to the drain electrode in a stacking manner.

Alternatively, a passivation layer is arranged on the pixel electrode, and a common electrode of a comb-like structure is arranged on the passivation layer.

Alternatively, the data line and the source electrode are arranged on an identical layer and in electrical connection to each other.

In yet another aspect, the present invention provides a display device, including the above-mentioned array substrate and a color film substrate.

In the present invention, by changing the layout process, the source electrode and the drain electrode are formed on different layers, so as to reduce the channel length of the TFT, usually from 15 μm to 5 μm. As a result, it is able to remarkably reduce the channel resistance, which will remarkably improve the charging efficiency of the TFT and reduce its charging time, thereby to improve the working efficiency of the TFT. In addition, due to a reduction in a size of the channel, it is also able to reduce an area of the TFT, thereby to facilitate the implementation of a highly-integrated product.

DETAILED DESCRIPTION OF THE PREFERRED EMBODIMENTS

The present invention will be described hereinafter in conjunction with the drawings and the embodiments. The following embodiments are for illustrative purposes only, but shall not be used to limit the present invention.

First Embodiment

Figure 1:
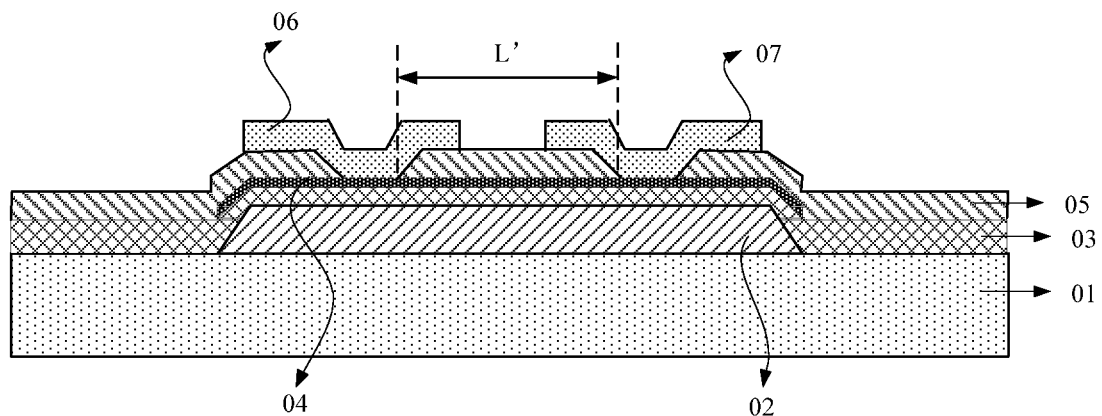
FIG. 1 is a schematic view showing an existing TFT.
Figure 2:
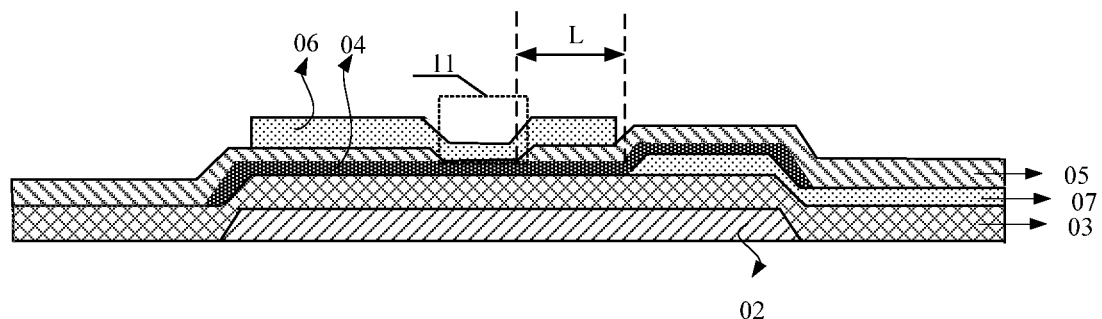
FIG. 2 is a schematic view showing a structure of a TFT according to the first embodiment of the present invention.

In this embodiment, the present invention provides a thin film transistor (TFT) which includes, as shown in FIG. 2, a gate electrode 02, a source electrode 07, a drain electrode 06 and a semiconductor layer 04. The source electrode 07 and the drain electrode 06 are arranged on different layers, and the semiconductor layer 04 is in electrical connection to the source electrode 07 and the drain electrode 06, respectively. A region on the semiconductor layer 04 which is corresponding to a region between the source electrode 07 and the drain electrode 06 is a channel region.

Because the source electrode and the drain electrode are not arranged on an identical layer, the manufacturing of the TFT will not be limited by the process accuracy, as compared with the situation where the source electrode and the drain electrode are arranged on the same layer. As a result, it is possible to remarkably reduce a channel length (L, in FIG. 2, represent the length of the channel) between the source electrode and the drain electrode, i.e. to less than 5 μm according to the current process accuracy, since reducing the channel length will reduce the charging time, it will remarkably improve the charging efficiency of the TFT, thereby to improve the working efficiency of the TFT.

The source electrode 07 and the drain electrode 06 are arranged at two sides of the semiconductor layer 04, i.e., above and below the semiconductor layer 04, respectively. As shown in FIG. 2, the source electrode 07 is located below the semiconductor layer 04, whereas the drain electrode 06 is located above the semiconductor 04. To be specific, there are two ways for the source electrode 07 and the drain electrode 06 being arranged on different layers in the embodiment. One is to arrange the source electrode 07 above the semiconductor layer 04 and arrange the drain electrode 06 below the semiconductor layer 04; and the other way is to arrange the drain electrode 06 above the semiconductor layer 04 and arrange the source electrode 07 below the semiconductor layer 04. The latter is used as an example in this embodiment.

Further, the semiconductor layer 04 may be made of a-Si, treated poly-Si, or a metal oxide semiconductor material. If the semiconductor layer 04 is made of the metal oxide semiconductor material, an etch mask layer may be arranged on the semiconductor layer 04 and at a position corresponding to the channel region. The etch mask layer 05 is made of an insulating material, so as to prevent semiconductor properties of the semiconductor layer from being damaged in the subsequent processes. Especially, for the metal oxide semiconductor material, since it is sensitive to water, oxygen, etc., so the etch mask layer 05 may be used to prevent the properties of the TFT from being affected due to the damaged semiconductor properties in the subsequence processes such as exposing and etching.

The etch mask layer 05 may be merely arranged at the channel region which refers to a region between the source electrode and the drain electrode. Also, it may be arranged at the channel region and a region outside of the channel region, i.e., it may be extended to a pixel region, and even to the entire substrate.

As shown in FIG. 2, when the drain electrode 06 is arranged above the semiconductor layer 04, the etch mask layer 05, which is arranged between the drain electrode 06 and the semiconductor layer 04, is provided with a via-hole 11 at a position corresponding to a position where the drain electrode 06 connects to the semiconductor layer 04, so as to the drain electrode 06 is in electrical connection to the semiconductor layer 04 through the via-hole.

Alternatively, when the source electrode 07 is arranged above the semiconductor layer 04, the etch mask layer 05, which is arranged between the source electrode 07 and the semiconductor layer 04, is provided with the via-hole at a position corresponding to the position where the source electrode 07 connects to the semiconductor layer 04, so as to the source electrode 07 is in electrical connection to the semiconductor layer 04 through the via-hole.

In the TFT as shown in FIG. 2, a gate insulating layer 03 is further arranged between the semiconductor layer 04 and the gate electrode 02 and completely covers the gate electrode 02. The gate electrode 02 and the gate insulating layer 03 may be manufactured by the following steps: forming a metal layer on a substrate 01, forming a pattern of the gate electrode 02 by a layout process, and then forming the gate insulating layer 03 on the gate electrode 02. Apart from covering the gate electrode 02, the gate insulating layer 03 may also cover the entire substrate 01 outside the gate electrode 02.

As mentioned above, a bottom-gate type TFT is taken as an example in this embodiment. Of course, alternatively, the TFT may also be a top-gate type TFT, and the principle thereof is similar to that of the bottom-gate type TFT, which will not be repeated herein.

In this embodiment, the source electrode and the drain electrode of the TFT are arranged on different layers, so the manufacturing of the TFT is not limited by the process accuracy as compared with the prior art where the source electrode and the drain electrode are arranged on an identical layer. Even if the factors, such as the redundancy of the via-holes in the etch mask layer and through which the drain electrodes electrically connect to the semiconductor layer, are taken into consideration, it is merely required to maintain the existing accuracy of an exposing machine, e.g., 5 μm, i.e., the channel length may be remarkably reduced from 15 μm to 5 μm. As a result, it is able to reduce the charging time and improve the charging efficiency of the TFT, thereby to improve the working efficiency of the TFT.

Second Embodiment

Figure 3:
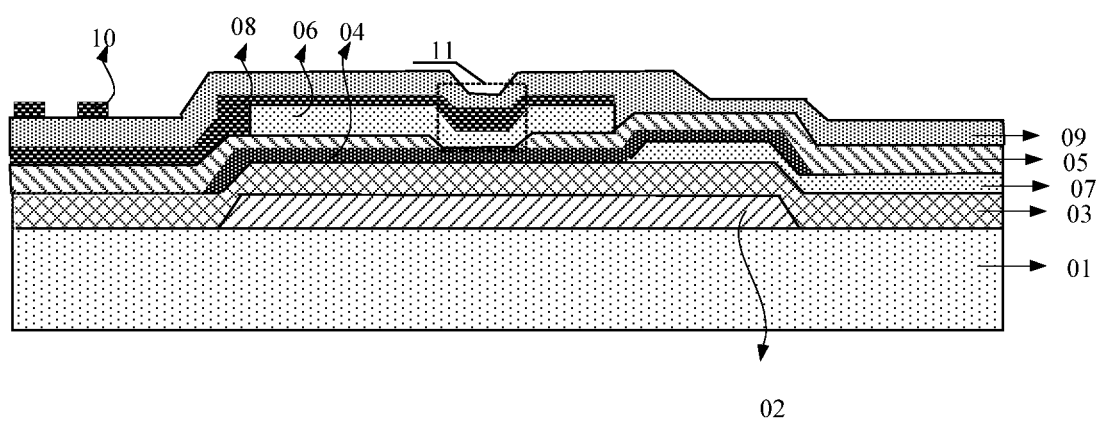
FIG. 3 is a schematic view showing a structure of an array substrate according to the second embodiment of the present invention.

In this embodiment, the present invention provides an array substrate which includes, as shown in FIG. 3, the substrate 01, the TFT, a pixel electrode 08, a gate line (not shown in FIG. 3) and a data line (not shown in FIG. 3). The TFT and the gate line are arranged on the substrate 01, and the source electrode 07 and the source electrode 06 of the TFT are arranged on different layers. The semiconductor layer 04 of the TFT is in electrical connection to the source electrode 07 and the drain electrode 06, respectively; the pixel electrode 08 is in electrical connection to the drain electrode 06, and the source electrode 07 of the TFT is in electrical connection to the data line.

Preferably, the source electrode 07 and the drain electrode 06 of the TFT being arranged on different layers, which including:

The source electrode 07 and the drain electrode 06 are arranged at two sides of the semiconductor layer 04, i.e., above and below the semiconductor layer 04, respectively. Wherein, the source electrode 07 is arranged above the semiconductor layer 04 and connected to the data line, the drain electrode 06 is arranged below the semiconductor layer 04, and the pixel electrode 08 is arranged below the semiconductor layer 04; or the drain electrode 06 is arranged above the semiconductor layer 04, the source electrode 07 is arranged below the semiconductor layer 04, and the pixel electrode 08 is arranged above the semiconductor layer 04. In order to enable the pixel electrode 08 to be in electrical connection to the drain electrode 06, it is required to arrange both the pixel electrode 08 and the drain electrode 06 above or below the semiconductor layer 04 at the same time, i.e., both the pixel electrode 08 and the drain electrode 06 are arranged at the same side of the semiconductor layer 04.

Alternatively, the array substrate further includes a common electrode 10, and a passivation layer 09 arranged between the pixel electrode 08 and the common electrode 10. As shown in FIG. 3, the passivation layer 09 is arranged on the pixel electrode 08, and the common electrode 10 is arranged on the passivation layer 09.

Alternatively, the common electrode 10 is arranged above the pixel electrode 08, i.e., the common electrode 10, the passivation layer 09 and the pixel electrode 08 are sequentially arranged from top to bottom; or the common electrode 10 is arranged below the pixel electrode 08, i.e., the pixel electrode 08, the passivation layer 09 and the common electrode 10 are sequentially arranged from top to bottom. The pixel electrode 08 is in electrical connection to the drain electrode 06 through a via-hole formed in the passivation layer, as shown in FIG. 3.

Alternatively, the etch mask layer 05 is arranged on the semiconductor layer 04. As the same as the first embodiment, the etch mask layer 05 can be merely arranged at the channel region, or at both the channel region and a region outside the channel region.

Alternatively, the etch mask layer 05 is provided with the via-hole 11 which is arranged at a region corresponding to the drain electrode 06, and the drain electrode 06 is in electrical connection to the semiconductor layer 04 through the via-hole 11, as shown in FIG. 3;

Or, the etch mask layer 05 is provided with the via-hole 11 which is arranged at a region corresponding to the source electrode 07, and the source electrode 07 is in electrical connection to the semiconductor layer 04 through the via-hole 11.

Alternatively, the pixel electrode 08 is arranged on the drain electrode 06 and in electrical connection thereto in a stacking manner. As shown in FIG. 3, the pixel electrode 08 covers the drain electrode 06.

Preferably, the passivation layer 09 is arranged on the pixel electrode 08, so as to protect the pixel electrode 08 and the etch mask layer 05, etc. The common electrode 10 of a comb-like structure is arranged on the passivation layer 09, as shown in FIG. 3.

It is also to be appreciated that, the data lines in the TFT are arranged on the same layer as the source electrode 07. Although the data line is not shown in FIG. 3, the data line and the source electrode 07 are arranged on a same layer and in electrical connection to each other.

The array substrate in this embodiment can achieve the same advantageous effect as the TFT in the first embodiment, i.e., it is able to reduce the channel length of the TFT from 15 μm to less than 5 μm and to remarkably reduce the channel resistance. As a result, it is able to remarkably improve the charging efficiency of the TFT and reduce its charging time, thereby to improve the working efficiency of the TFT. In addition, because the channel length is reduced, it is able to reduce a size of the TFT, thereby to improve a product integration of the TFT on the array substrate.

Figure 4:
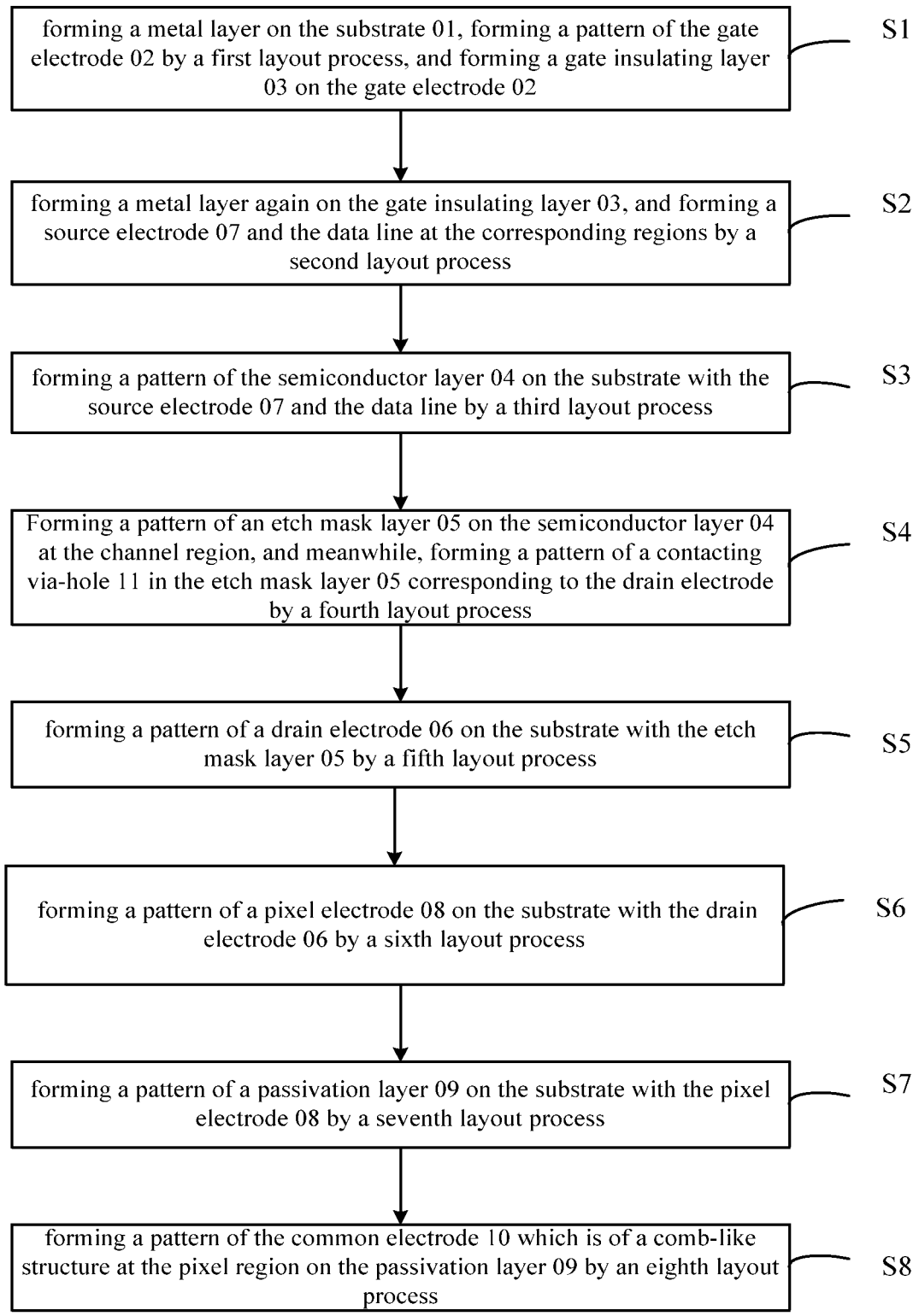
FIG. 4 is a flow chart showing a method for manufacturing the array substrate according to the third embodiment of the present invention.

As shown in FIG. 4, the array substrate may be manufactured by the following steps.

Figure 5:
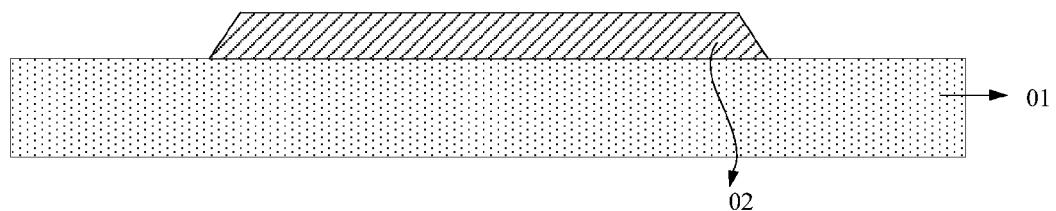
FIG. 5 is a schematic view showing a pattern of gate electrode formed by a first layout process.
Figure 6:
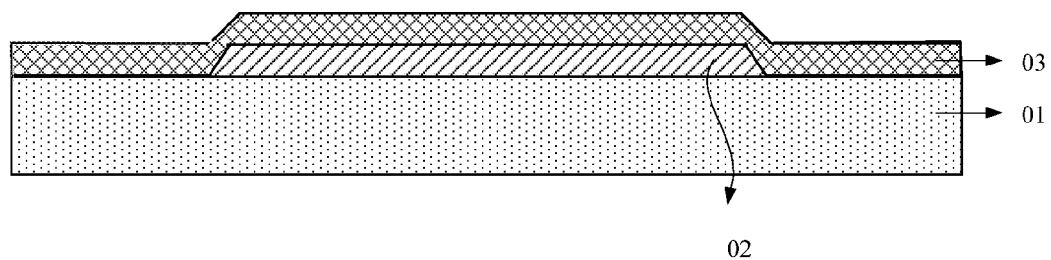
FIG. 6 is a schematic view showing a gate insulating layer formed on the gate electrode.

Step S1: forming a metal layer on the substrate 01, forming a pattern of the gate electrode 02 by a first layout process, as shown in FIG. 5. Further forming the gate insulating layer 03 on the gate electrode 02, as shown in FIG. 6.

Figure 7:
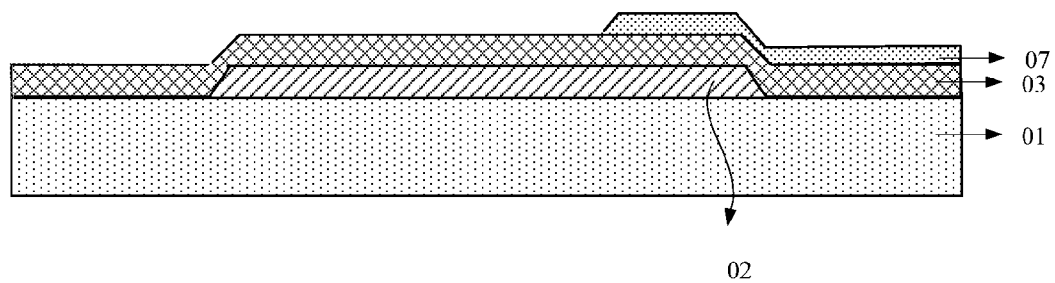
FIG. 7 is a schematic view showing a source electrode and a data line formed by a second layout process.

Step S2: forming a metal layer again on the gate insulating layer 03, and forming the source electrode 07 and the data line (not shown) at the corresponding regions by a second layout process, as shown in FIG. 7.

Figure 8:
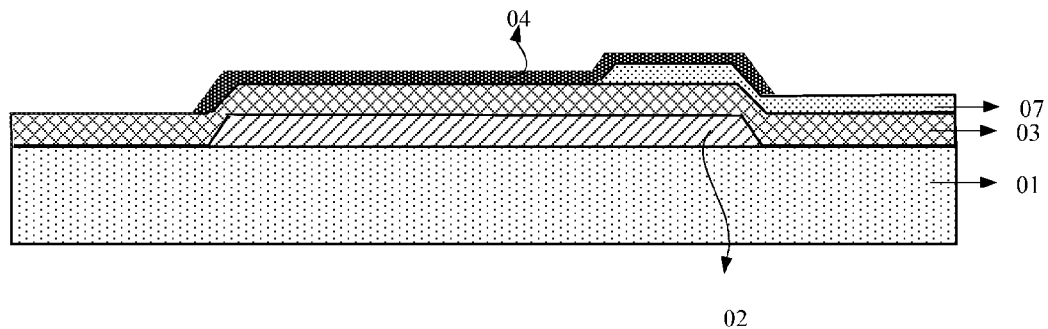
FIG. 8 is a schematic view showing a pattern of a semiconductor layer formed by a third layout process.

Step S3: forming a pattern of the semiconductor layer 04 on the substrate with the source electrode 07 and the data line by a third layout process, as shown in FIG. 8. To be specific, the semiconductor layer 04 may be made of a metal oxide semiconductor material, e.g., IGZO.

Figure 9:
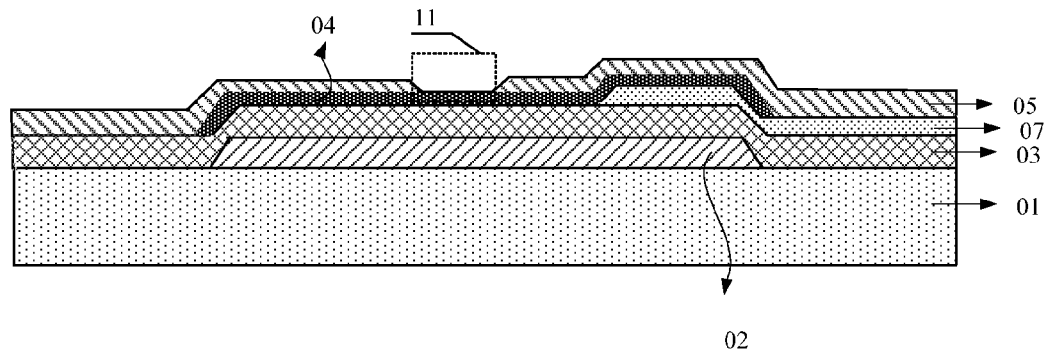
FIG. 9 is a schematic view showing an etch mask layer and a via-hole formed by a fourth layout process.

Step S4: forming a pattern of the etch mask layer 05 on the semiconductor layer 04 at the channel region by a fourth layout process, and meanwhile, a pattern of the via-hole 11 in the etch mask layer 05 corresponding to the drain electrode can be formed, as shown in FIG. 9.

Figure 10:
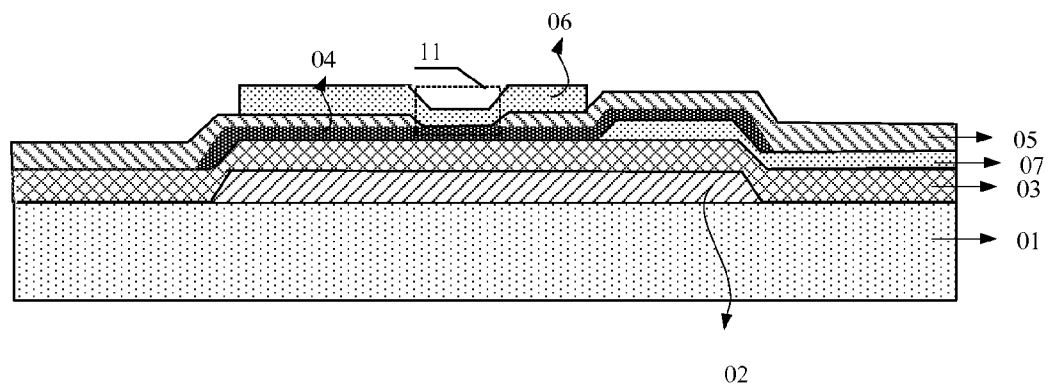
FIG. 10 is a schematic view showing a pattern of a drain electrode formed by a fifth layout process.

Step S5: forming a pattern of the drain electrode 06 on the substrate with the etch mask layer 05 by a fifth layout process, as shown in FIG. 10.

Figure 11:
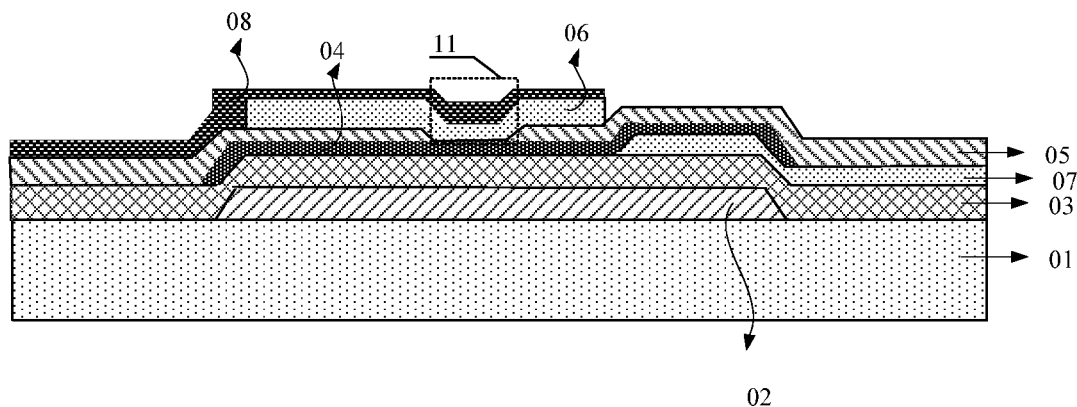
FIG. 11 is a schematic view showing a pattern of a pixel electrode formed by a sixth layout process.

Step S6: forming a pattern of the pixel electrode 08 on the substrate with the drain electrode 06 by a sixth layout process, as shown in FIG. 11. Alternatively, the pattern of the pixel electrode 08 may be of a comb-like shape or a plate-like shape at a pixel region.

Alternatively, steps S5 and S6 may be performed by a single layout process. To be specific, a pixel electrode layer is formed on the substrate with the patterns of the etch mask layer 05 and the via-hole 11, a metal layer is formed on the pixel electrode layer, and then the patterns of the pixel electrode and the drain electrode are formed on the substrate by a gray-scale exposing process. At this time, the pixel electrode is in electrical connection to the drain electrode in a stacking manner.

Figure 12:
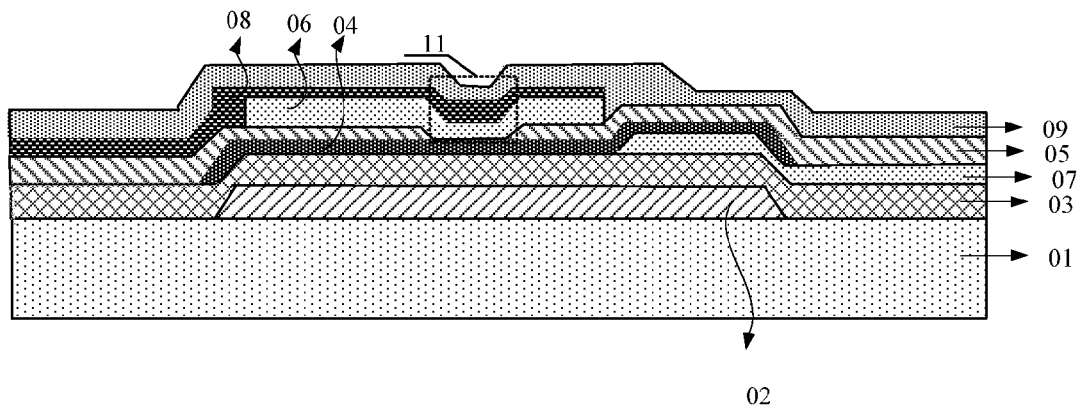
FIG. 12 is a schematic view showing a pattern of passivation layer formed by a seventh layout process.

Step S7: forming a pattern of the passivation layer 09 on the substrate with the pixel electrode 08 by a seventh layout process, as shown in FIG. 12.

Step S8: forming a pattern of the common electrode 10 on the passivation layer 09 by an eighth layout process. The common electrode 10 is of a comb-like structure at the pixel region.

Different from the manufacturing method and process in the prior art where the source electrode and the drain electrode are formed on the same layer, in this embodiment, after the gate electrode and the gate insulating layer are formed on the substrate, the source electrode is formed on the gate insulating layer, and then, after the semiconductor layer and the etch mask layer are formed, the drain electrode is formed. As a result, it is able to reduce the channel length of the TFT to less than 5 µm, thereby to remarkably reduce the channel resistance and improve the working efficiency of the TFT.

In addition, because the channel length of the TFT is reduced, it is able to reduce a size of the TFT, thereby to improve a product integration of the TFTs on the array substrate.

Third Embodiment

In this embodiment, the present invention also provides a display device, including a color film substrate and the array substrate in the second embodiment.

The display device may be any product or member having a display function, such as an OLED panel, a TV, a digital photo frame, a mobile phone and a flat panel PC.

The above embodiments are for illustrative purposes only, but shall not be used to limit the present invention. A person skilled in the art may make further modifications and improvements without departing from the spirit and scope of the present invention, and these modifications and improvements also fall within the scope of the present invention. The scope of the present invention shall be subject to the appended claims.

What is claimed is:

1. An array substrate, comprising a substrate, a TFT, a pixel electrode, a gate line and a data line, wherein:
the TFT and the gate line are arranged on the substrate;
a source electrode and a drain electrode of the TFT are arranged on different layers;
a semiconductor layer of the TFT is in electrical connection to the source electrode and the drain electrode, respectively;
the pixel electrode is in electrical connection to the drain electrode of the TFT;
the source electrode of the TFT is in electrical connection to the data line; and
wherein: the source electrode of the TFT is arranged above the semiconductor layer of the TFT and the data line is located at an identical layer to the source electrode of the TFT, the drain electrode of the TFT is arranged below the semiconductor layer of the TFT and the pixel electrode is arranged below the semiconductor layer of the TFT, a lower surface of the source electrode of the TFT covers a part of an upper surface of the semiconductor layer of the TFT, and a lower surface of the semiconductor layer of the TFT covers a part of an upper surface of the drain electrode of the TFT.

2. The array substrate according to claim 1, further comprising a common electrode, and a passivation layer arranged between the pixel electrode and the common electrode.

3. The array substrate according to claim 2, wherein the common electrode is arranged above or below the pixel electrode.

4. The array substrate according to claim 1, wherein an etch mask layer is arranged on the semiconductor layer.

5. The array substrate according to claim 4, wherein the etch mask layer is provided with a via-hole which is arranged at a region corresponding to the drain electrode, and the drain electrode is in electrical connection to the semiconductor layer through the via-hole; or
the etch mask layer is provided with a via-hole which is arranged at a region corresponding to the source electrode, and the source electrode is in electrical connection to the semiconductor layer through the via-hole.

6. The array substrate according to claim 1, wherein the pixel electrode is arranged on the drain electrode, and the pixel electrode is in electrical connection to the drain electrode in a stacking manner.

7. The array substrate according to claim 1, wherein a passivation layer is arranged on the pixel electrode, and a common electrode of a comb-like structure is arranged on the passivation layer.

8. A display device, comprising the array substrate according to claim 1 and a color film substrate.

9. The display device according to claim 8, wherein an etch mask layer is arranged on the semiconductor layer.

10. The array substrate according to claim 1, wherein a part of the source electrode of the TFT and the semiconductor layer of the TFT are stacked along a vertical direction, and a part of the drain electrode of the TFT and the semiconductor layer of the TFT are stacked along the vertical direction.

11. The display device according to claim 8, wherein a part of the source electrode of the TFT and the semiconductor layer of the TFT are stacked along a vertical direction, and a part of the drain electrode of the TFT and the semiconductor layer of the TFT are stacked along the vertical direction.

* * * * *